US006463392B1

(12) United States Patent
Nygaard et al.

(10) Patent No.: US 6,463,392 B1
(45) Date of Patent: Oct. 8, 2002

(54) SYSTEM AND METHOD FOR ADJUSTING A SAMPLING TIME IN A LOGIC ANALYZER (75) Inventors: Richard A. Nygaard; Edward G. Pumphrey; Keith C. Griggs, all of Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/375,307

(22) Filed: Aug. 16, 1999

(51) Int. Cl.$^7$ ............................................... G01D 18/00
(52) U.S. Cl. ......................................... 702/89; 73/1.42
(58) Field of Search .............................. 702/89, 57, 58, 702/65–67, 69, 71, 72, 74, 79, 81, 82, 84, 112, 116, 117, 120, 124, 125, 182, 183, 185; 73/1.42, 1.34

(56) References Cited

U.S. PATENT DOCUMENTS

| | | | |
|---|---|---|---|
| 4,390,837 | * | 6/1983 | Hotvedt .................... 324/73 R |
| 4,471,348 | * | 9/1984 | London et al. ............. 340/722 |
| 4,558,422 | * | 12/1985 | DenBeste et al. ............. 702/57 |
| 4,641,348 | * | 2/1987 | Neuder et al. ................. 382/1 |
| 4,761,640 | * | 8/1988 | Slavin ........................ 340/709 |
| 4,779,028 | * | 10/1988 | Blair .......................... 315/367 |
| 4,982,350 | * | 1/1991 | Perna et al. ................... 702/89 |
| 5,043,927 | * | 8/1991 | Jackson ....................... 702/66 |
| 5,159,337 | * | 10/1992 | Lankreijer ..................... 341/67 |
| 5,162,723 | * | 11/1992 | Marzalek et al. ........... 324/77 B |
| 5,180,971 | * | 1/1993 | Montijo ....................... 324/121 |
| 5,282,213 | * | 1/1994 | Leigh et al. ................ 371/22.1 |
| 5,526,286 | * | 6/1996 | Sauerwein et al. ............ 702/79 |
| 5,845,233 | * | 12/1998 | Fishburn ..................... 702/108 |
| 5,854,996 | * | 12/1998 | Overhage et al. ........... 702/189 |
| 6,192,321 | * | 2/2001 | Grumstrup et al. ......... 702/113 |
| 6,195,617 | * | 2/2001 | Miller ........................ 702/125 |
| 6,246,408 | * | 6/2001 | Alexander .................. 345/348 |

* cited by examiner

Primary Examiner—Marc S. Hoff
Assistant Examiner—Edward Raymond (57) ABSTRACT

A system and method are provided for detecting a stable region in a data signal to facilitate the alignment between a data signal and a corresponding clock signal. The system includes a processor coupled to a local interface and a memory coupled to the local interface. The system also includes a boundary detection circuit configured to perform a simultaneous sampling of a reference signal and a delayed reference signal to ascertain a degree of stability of a position in the reference signal. The reference signal is the signal received from the target system and the delayed reference signal is a delayed copy of the reference signal. The system also includes boundary detection logic stored on the memory and executed by the processor to control the operation of the boundary detection circuit. The boundary detection logic includes logic to detect a boundary of the stable region of the reference.

35 Claims, 8 Drawing Sheets

SYSTEM AND METHOD FOR ADJUSTING A SAMPLING TIME IN A LOGIC ANALYZER

TECHNICAL FIELD

The present invention is generally related to the field of digital analysis and, more particularly, is related to a system and method for adjusting a sampling time in a logic analyzer.

BACKGROUND OF THE INVENTION

Current manufacturers of high speed computer equipment often need to access data information that is communicated on a data bus or other conductors within the machine for testing or other reasons. Conventional approaches to accessing data on a bus include the use of logic analyzers that provide probes that are placed in electrical contact with the particular conductors in question.

Typically, logical analyzers obtain data transferred on one or more data pathways as well as a clock signal that is synchronized with the data signal(s) on the data pathways that control the sampling function necessary to recover data. Unfortunately, due to the ever increasing speed at which data is transferred across these pathways, it has become more and more difficult to reliably sample the data on the conductors due to the relatively larger effects of skew, part to part variances, and logic analyzer signal loading. To allow for these effects, logic analyzers as well as high speed digital circuits themselves have incorporated means to deskew signals before sampling. Otherwise, the misalignment between the target data signals and the clock signal can result in corrupted data since the data may be sampled when it is transitioning between states rather than in stable regions that represent actual data or other value. In the case of logic analyzers, these means have relied on an operator to adjust the logic analyzer sampling positions using knowledge of the expected data values present on the conductors. This process of adjustment is labor intensive, tedious, and error prone.

SUMMARY OF THE INVENTION

In light of the foregoing, the present invention provides a system and method for detecting the stable regions in a data signal to facilitate the alignment between a data signal and a corresponding clock signal. In one embodiment, the system includes a processor coupled to a local interface and a memory coupled to the local interface. The system also includes a boundary detection circuit configured to perform a simultaneous sampling of a reference signal and a delayed version of the reference signal to ascertain a presence or absence of a number of transitions on the reference signal at a selectable position in time with respect to the associated input clock. The reference signal is one of the signals received from the target system and the delayed version of the reference signal is a delayed copy of the reference signal. The present invention also includes boundary detection logic stored on the memory and executed by the processor to control the operation of the boundary detection circuit. The boundary detection logic includes logic to detect a boundary of the stable regions of the reference signal by searching for a boundary between a stable region and an unstable region by sampling a number of positions in the reference signal according to a search pattern.

A method of the present invention comprises the steps of performing a simultaneous sampling of a reference signal and a delayed version of the reference signal to ascertain a number of transitions at a selectable position in time of the reference signal with respect to an associated clock input, and, detecting a boundary of the stable region of the reference signal by sampling a number of the selectable positions of the reference signal according to a search pattern.

An advantage of the invention is that it provides a means for detecting the position of boundaries of a stable region in the reference data signal relative to a clock signal. Once this information is known, then an appropriate delay to apply to the data signal to bring it into alignment with the clock signal or vice versa can be determined. The present invention is also advantageous in that is provides the relative location information in an automated fashion without requiring manual tuning. In addition, the present invention does not require prior knowledge of the sequence of data values tested to achieve the tuning.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
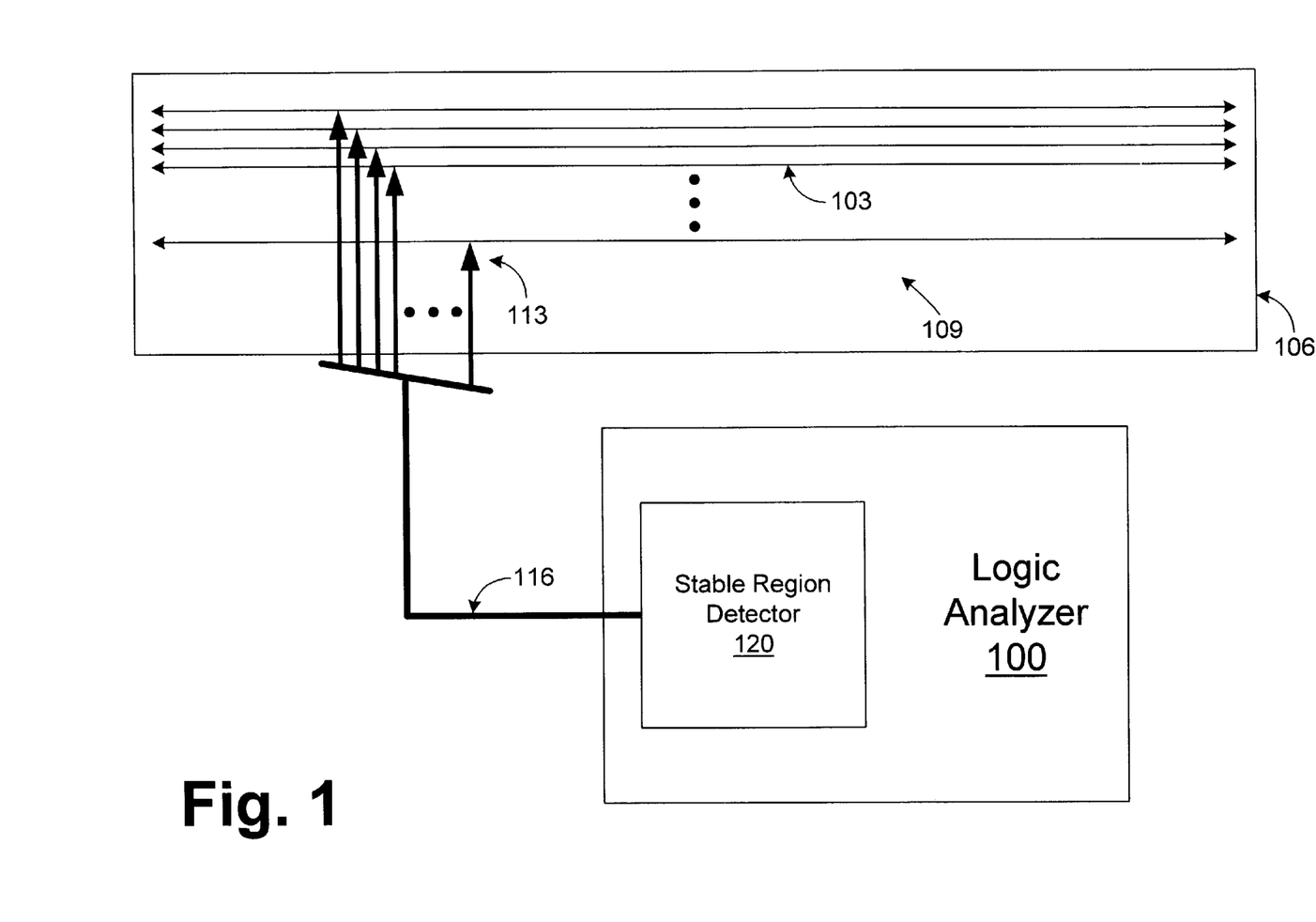
FIG. 1 is a block diagram of a logic analyzer probing a target system according to an embodiment of the present invention.

Turning to FIG. 1, shown is a logic analyzer 100 according to an embodiment the present invention. The logic analyzer 100 is employed to access a data signal that typically resides on conductors 103 of a target system 106 that may be, for example, a computer system or other like device. In a typical situation, the logic analyzer 100 may be employed to access the data that is flowing across a number of conductors 103 of a bus 109. Thereafter, analysis is performed on the data in an effort to test the operation of the target system that employs the particular bus 109 in question. The bus 109 may be a data bus, a control bus, or other conductor or group of conductors employed to transfer a data signal.

The logic analyzer includes several probes 113 coupled to the logic analyzer 100 via a cable 116. To access the data signals on the bus 109, one or more of the probes 113 may be placed in electrical contact with to one or more conductors 103 of the bus 109. One probe 113 of the logic analyzer 100 is placed on a conductor 103 of the target system 106 on which a clock signal resides. In typical target systems 106, such a clock is employed to identify when valid data is present on the bus 109 or other conductor 103. The logic analyzer 100 includes a stable region detector 120 that is used to calibrate the logic analyzer 100 in probing signals on the bus 103 of the target system 106. The stable region detector 120 identifies a periodic position in time in the data signal at which a valid data value may be obtained, as opposed to regions of transition of the data signal from a logical "0" to a logical "1" or vice versa. This warrants further explanation.

Figure 2:
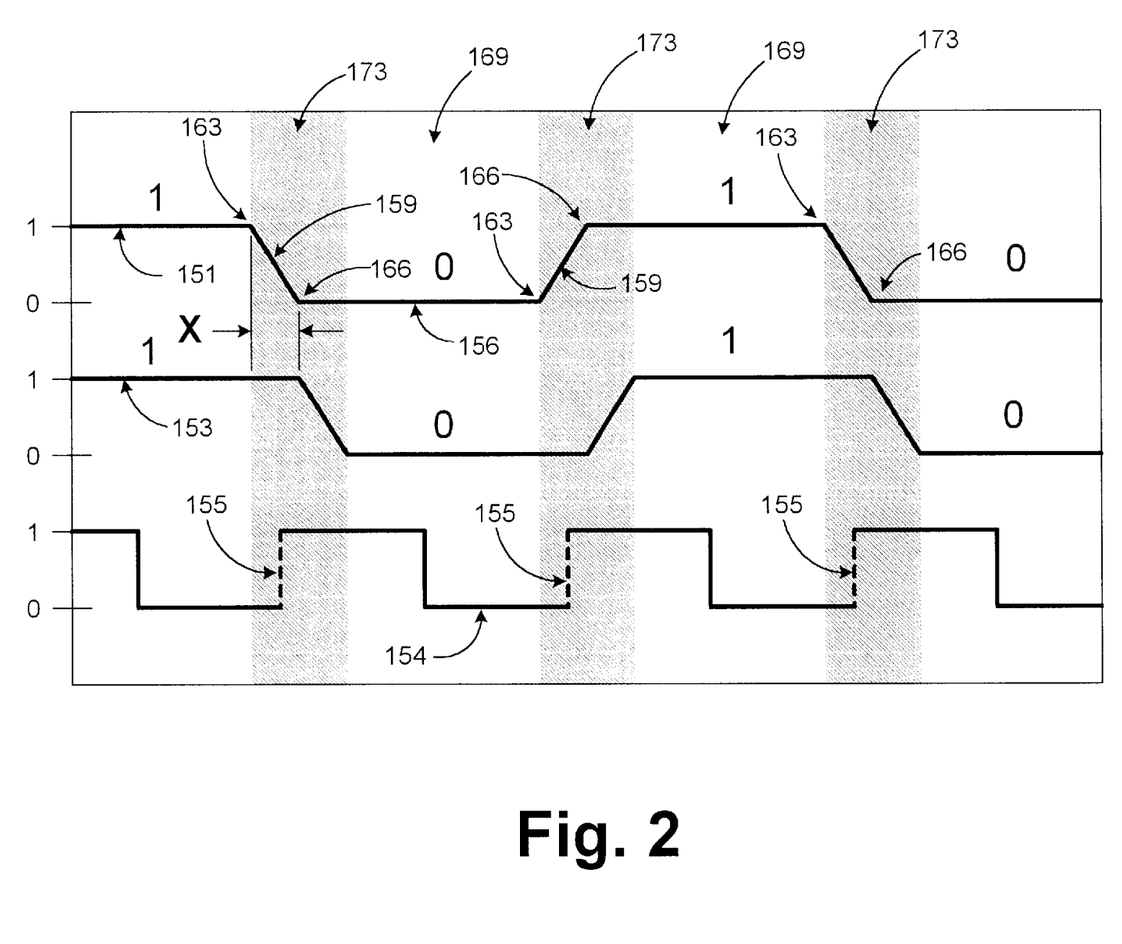
FIG. 2 is a graph of a reference signal, a delayed version of the reference signal, and a clock signal employed in the logic analyzer of FIG. 1.

With reference to FIG. 2, shown is a graph of a pair of data signals as seen on an oscilloscope. In particular, shown are a reference signal 151, a delayed version of the reference signal 153, and a clock signal 154. The delayed reference signal 153 is actually the same signal as the reference signal 151 with a small delay X. Both the reference signal 151 and the delayed reference signal 153 are made up of a series of data bits that periodically experience stable regions 156 and transition regions 159. The stable regions 156 generally represent a data value commensurate with the particular voltage level on the particular conductor 103 (FIG. 1) in question. The actual voltage level will typically represent either a logical "1" or a logical "0" as shown. The voltage levels may transition, for example, between five volts representing a logical "1" to zero volts, representing a logical "0" in addition to many other voltage levels that may be employed to represent the same.

The stable regions 156 are "stable" in that the voltage does not fluctuate within the region itself such that it will not be mistaken for a logical "0" when it is a level of a logical "1" and vice versa. On the other hand, the transition regions 159 are those positions in time when the data value is moving between two values. In these regions, the data value may be either a logical "1" or a logical "0" depending upon a number of factors including, for example, the skew rate and the physical and electrical characteristics of the conductor from which the data signals are taken. Thus, in order to ascertain the particular data values in a data signal, one should sample the data signal periodically at predefined points in the stable regions 156.

In a typical target system, in order to ensure that the data signals are sampled at appropriate positions in the stable regions 156, the clock signal 154 is employed that is aligned in time with the data signal and that triggers an appropriate sampling function. The sampling may be set to occur, for example, at the positive clock transition 155 of the clock signal 154 as shown. These sampling functions often require a specific window of time within which the data signal must be stable to properly acquire a data value.

Currently, however, data signals and clock signals on typical busses in computer systems, for example, reach faster and faster speeds. At such speeds, the nature of the data signals or clocks may be greatly affected by the probes 113, cable 116, the electronics on the target system 106 that drive the data signal on bus 109, and other factors. Due to these factors, by the time a data signal and accompanying clock signal reach the logical analyzer 100 (FIG. 1), the clock signal may not be aligned properly with the data signal such that the sampling of the data signal for data acquisition in the logical analyzer 100 is inaccurate and may introduce error. Specifically, such misalignment may result, for example, in the sampling of the data signal in the transition region 159. As shown in FIG. 2, for example, the positive clock transition 155 of the clock signal 154 that triggers the sampling function lies in the middle of the transition region 159 of the reference signal 151 as shown.

In order to achieve proper alignment of the clock and corresponding data signal or data signals in the case a multiple conductor bus 109, the logical analyzer 100 includes the stable region detector 120 according to an embodiment of the present invention. The stable region detector 120 is employed to find the repeated stable regions 156 that represent the data bits in a data signal relative to the clock signal so that the two may be properly aligned.

To describe the approach taken by the stable region detector 120 in determining the precise location of the stable region 156, a relative position of both a trailing boundary 163 and a leading boundary 166 of the stable regions 156 with respect to the clock signal are determined. This is accomplished by receiving and splitting a reference signal 151 from one of the probes 113 (FIG. 1) into two reference signals 151, both of which are identical to the reference signal 151. One of these is subjected to a delay of an offset X, thereby resulting in the delayed reference signal 153. When the reference and delayed reference signals 151 and 153 are placed side by side as shown, essentially two different repeated zones result. First is a stable zone 169 in which the reference and delayed reference signals 151 and 153 are equal. Second is a transition zone 173 in which the reference and delayed reference signals 151 and 153 are not equal due to transitions and/or the intersection of different voltage levels.

The stable and transition zones 169 and 173 are advantageously used to detect the trailing and leading boundaries 163 and 166 of the reference signal 151. This is done by simultaneously sampling both the reference and the delayed reference signals 151 and 153 according to a particular search pattern to determine the closest point near the leading and trailing boundaries 163 and 166 for which the data values for both the signals 151 and 153 are the same. As shown in FIG. 2, due to the offset X, the trailing boundaries 163 fall at the border between the stable and transition zones 169 and 173. To find the trailing boundary 163, a variable delay in the clock signal 154 can be manipulated to cause it to shift relative to the reference signal 151 and the delayed reference signal 153 to determine a leftmost position in the corresponding stable regions of the reference signal 151 and the delayed reference signal for which the data values for both signals are identical. Note that the same effect is achieved by shifting the reference signal 151 and the delayed reference signal 153 with respect to the clock signal 154. In fact, in the ensuing discussion, the reference signal 151 is shifted appropriately for reasons that follow.

To explain further, reference is made to FIGS. 3A–3D that show a number of discrete time shifts applied to the reference signal 151 with respect to the positive clock transition 155 of the clock signal 154 and the delayed reference signal 153. It is understood herein, however, that either edge (or both edges) of the clock signal 154 may be used to trigger the sampling. To facilitate the discussion that follows, use of the positive clock transition 155 is assumed.

The discrete time shifts shown in FIGS. 3A–3D represent a binary search pattern used to locate the trailing boundary 163. In particular, first a delay is introduced to one or both of the reference and delayed reference signals 151 and 153 such that the positive clock transition 155 is placed in the middle of the stable zone 169 where both signals are equal. The precise delay introduced to both of the signals 151 and 153 can be determined in one of a number of ways, such as random selection, incremental sampling that starts at a random or other predetermined position, or other approach. Note however, that the delay applied to the delayed reference signal 153 is such that it lags behind the reference signal 151 so that the trailing boundary 163 lies on the border between the stable and transition zones 169 and 173. In this position, the data signals 151 and 153 are repeatedly sampled at the positive clock transition 155 simultaneously for a predetermined number of clock cycles, which may be 100,000 clock cycles, for example. If the simultaneous samples of both signals ever differ, then it is known that the positive clock transition 155 does not lie in the stable zone 169, and another location for positive clock transition 155 should be found and the sampling process repeated until the positive clock transition 155 lies in the stable zone 169.

Figure 3A:
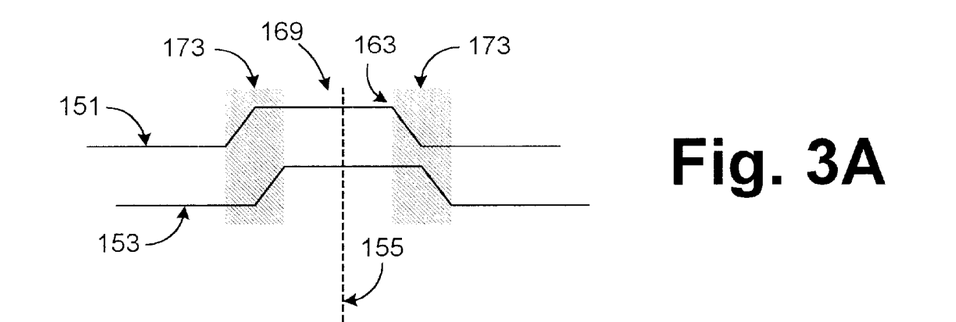
FIGS. 3A–D are graphs showing the reference signal and the delayed signal of FIG. 2 with respect to a sampling time.
Figure 3B:
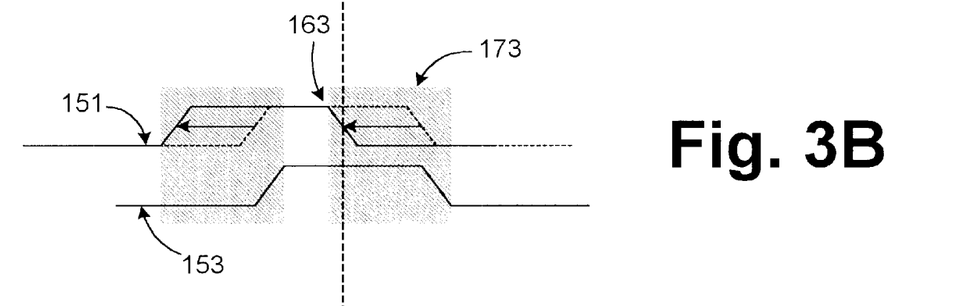

Once the starting position of the positive clock transition 155 is determined, then according to a binary search pattern, the reference signal 151 is time-shifted relative to the positive clock transition 155 time and the delayed reference signal 153 by a predetermined amount. Both signals 151 and 153 are sampled for another 100,000 clock cycles or so to see if the values obtained differ as they may due to the transitions occurring in the data signals 151 and 153, thus confirming that the positive clock transition 155 now lies in the transition zone 173 as shown in FIG. 3B. If it is found that the positive clock transition 155 is still in the stable zone 169 where the sampled numbers are still equal because a large enough shift was not executed, then another similar shift may be executed to ensure that the positive clock transition 155 lies in the transition zone 173.

Figure 3C:
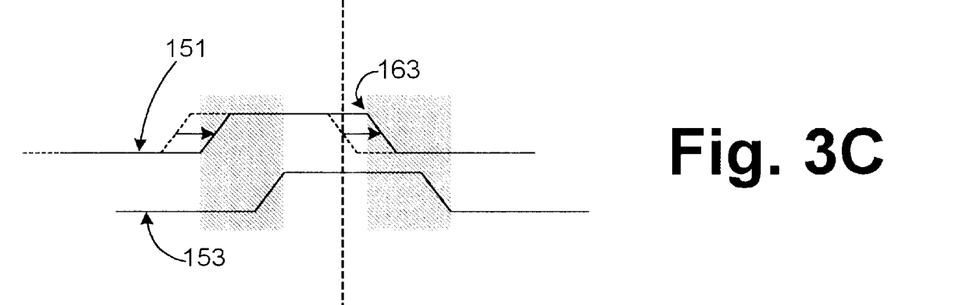
Figure 3D:
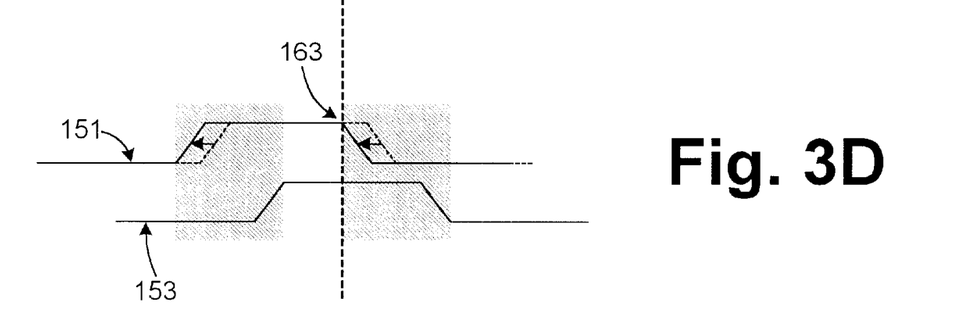

At this point, the reference signal 151 is shifted in the opposite direction by an amount that is half of the amount of the first shift, resulting in the location of the positive clock transition 155 in the stable zone 169 as shown in FIG. 3C. The actual location of the positive clock transition 155 is confirmed by sampling the signals for the 100,000 clock periods as before. If the shift did not place the positive clock transition 155 into the stable zone 169 as shown, then another shift could be executed to accomplish the desired position. In this manner, the positive clock transition 155 may be shifted back and forth in progressively smaller time shifts until the positive clock transition 155 lies at the location of the trailing boundary 163 as shown in FIG. 3D. To discover the leading boundary 166, a similar approach may be used, only in a reverse direction with where the delayed reference signal 153 is adjusted to precede slightly the reference signal 151 before the search pattern is begun such that the leading boundary 166 then defines the boundary between the stable and transition zones 169 and 173.

Note that a binary search pattern is not the only search pattern that may be employed to discover the trailing and leading boundaries 163 and 166. One may also employ a sweep search pattern in which the positive clock transition 155 is continually incremented by a uniform step size starting at the initial sampling time until the leading and trailing boundaries 163 and 166 are found. Also, a combined binary-sweep search pattern may be employed where the sweep search pattern is used until the transition zone 173 is discovered, and then the binary search pattern is used thereafter to zero in on the location of the particular boundary sought. Whichever search pattern is chosen, a distinct goal is to minimize the number of times that the signals are sampled to minimize the overall time it takes to align the clock signal with the reference data signal 151. Other search patterns may be employed as well that are included herein as within the scope of the present invention.

In addition, the forgoing assumes that various delays are increased or reduced in the reference and delayed reference signals 151 and 153 to move the positive clock transition 155 relative to these signals. It may also be possible to delay the clock signal itself to accomplish the same result.

Figure 4:
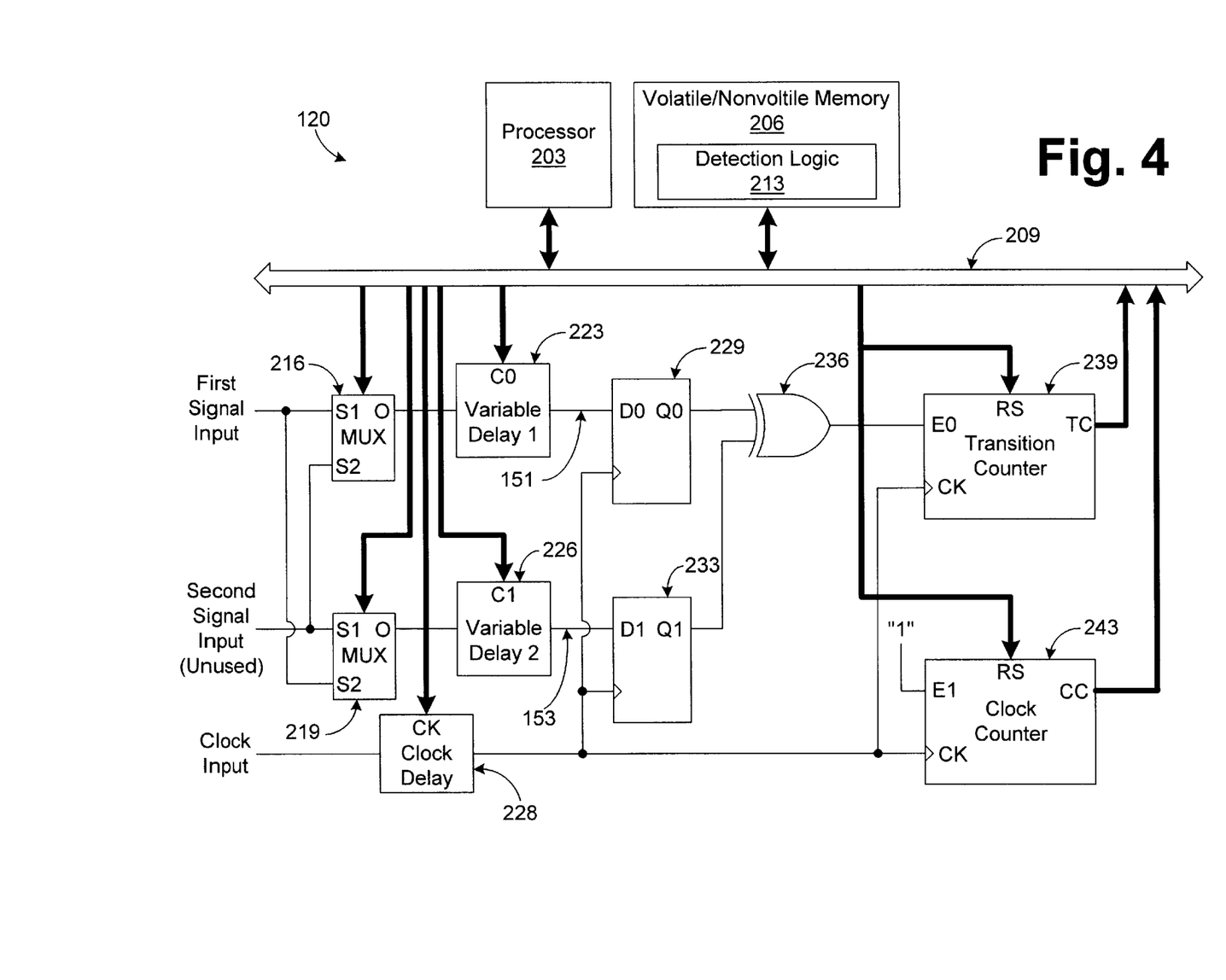
FIG. 4 is a block diagram of a stable region detector employed in the logic analyzer of FIG. 1.

With reference to FIG. 4, shown is the stable region detector 120 according to an embodiment of the present invention. The stable region detector 120 includes a processor 203 and a volatile/nonvolatile memory 206, both of which are coupled to a local interface 209. The local interface 209 may comprise for example, a data bus and a control bus. Stored on the volatile/nonvolatile memory 206 is detection logic 213 that is executed by the processor 203 and controls the operation of the stable region detector 120.

The stable region detector 120 further comprises a first input multiplexer 216 and a second input multiplexer 219, each having a signal input S1 and a shared signal input S2. The output of the first input multiplexer 216 is coupled to an input of a first variable delay 223. Likewise, the output of the second input multiplexer 219 is coupled to an input of a second variable delay 226. In addition, a clock input is applied to a clock delay 228. The outputs of the first and second variable delays 223 and 226 are coupled to corresponding inputs of a first flip-flop 229 and a second flip-flop 233. Both of the flip-flops 229 and 233 receive the clock input from the clock delay 228 to trigger the flip-flops 229 and 233 to read a data value from their inputs D0 and D1 and to convey that data value to their respective outputs Q0 and Q1. The outputs Q0 and Q1 are coupled to the inputs of an exclusive-or gate 236. The output of the exclusive-or gate 236 is coupled to enable input E0 of a transition counter 239. Also, the clock input is applied to the transition counter 239 and a clock counter 243 as shown. In addition, the clock counter 243 receives a logical "1" at its enable input E1. Note that the clock input is received from clock control circuitry (not shown) in the logic analyzer 100 that controls whether the clock input is applied to the stable region detector 120 to control the activation of the detector 120.

The first and second input multiplexers 216 and 219 each include a control input that is coupled to the local interface 209 that controls which of the inputs S1 or S2 are applied to the respective outputs. Also, the first, second, and clock delays 223, 226, and 228 each include a control input C0, C1, and CK respectively, that is coupled to the local interface 209 through which the variable delays 223, 226, and 228 are configured. Additionally, the transition counter 239 and the clock counter 243 include a reset input RS that is coupled to the local interface as well as a transition counter output TC and a clock counter output CC as shown.

Next the general operation of the stable region detector 120 is described. To begin, a first signal input received via one of the probes 113 (FIG. 1) and the cable 116 (FIG. 1) is applied to the S1 input of the first multiplexer 216 and also to the S2 input of a second multiplexer 219. The first signal input is thereby split into a reference signal 151 (FIG. 2) and a delayed version of the reference signal 153 (FIG. 2) at the output O of the multiplexer 216 and the output O of multiplexer 219, respectively. The split signals are then applied to the first and second variable delays 223 and 226. Note that a second signal input from another probe 113 may be received as shown, but is not used. Once the clock signal is aligned with the first signal input as is described, the whole process is repeated for the second signal input in the same manner.

The variable delays 223 and 226 are set such that the signals 151 and 153 are delayed relative to each other as was discussed with reference to FIG. 3. Once the variable delays 223 and 226 are set, the signals are sampled simultaneously by triggering the flip-flops 229 and 233 via the clock inputs. When the outputs of the flip-flops 229 and 233 are not equal to each other, the exclusive-or gate 236 triggers the enable input E0 of the transition counter 239. In this manner, the transition counter 239 will count the number of clock cycles for which the outputs of the flip-flops 229 and 233 are not equal. The clock counter 243 concurrently tracks the number of clock cycles that have occurred. Using the clock counter 243, one may monitor the number of clock cycles to ensure a minimum number of clock cycles are received before sampling ceases. The values held by the transition counter 239 and the clock counter 243 are made available to the processor 203 via the local interface 209. Note that for a given clock cycle limit, the stimulus at the probe input should contain a minimum threshold number of transitions in the data signals 151 and 153. Generally, if there is an inequality for at least 1% of the total clock cycles, then the stimulus is adequate, although any limit may be used. The processor 203 controls the general operation of the stable region detector 120 as it executes the detection logic 213.

Note that the various above described components are representative of other types of components that may be employed to accomplish the functionality thereof. For example, the functionality of the exclusive-or gate 236 may be accomplished using comparators or other similar components.

The variable delays 223 and 226 may comprise a number of inverter pairs or other similar logical component coupled in series with a number of taps located at the outputs of every other inverter. A signal that progresses through the variable delays 223 and 226 experiences a delay due to the time it takes for the signal to propagate through the inverter pairs. An overall delay is determined by choosing a tap at a predetermined position from the variable delay input based upon the control signal received. Consequently, a particular delay may be created by forcing the signal to progress through a predetermined number of inverter pairs. Note then, that the variable delays 223 and 226 can be altered in discrete steps, depending upon which tap is selected by the control input. These discrete steps may not be uniform due to imperfections in the physical components, etc. Consequently, it is desirable to find the tap that represents the delay in time that is the closest stable position to the trailing and leading boundaries 163 and 166 the reference signal 151 to ensure that the imperfections do not result in unreliable data acquisition due to a miscalculation of a trailing or leading boundary 163 and 166.

Figure 5A:
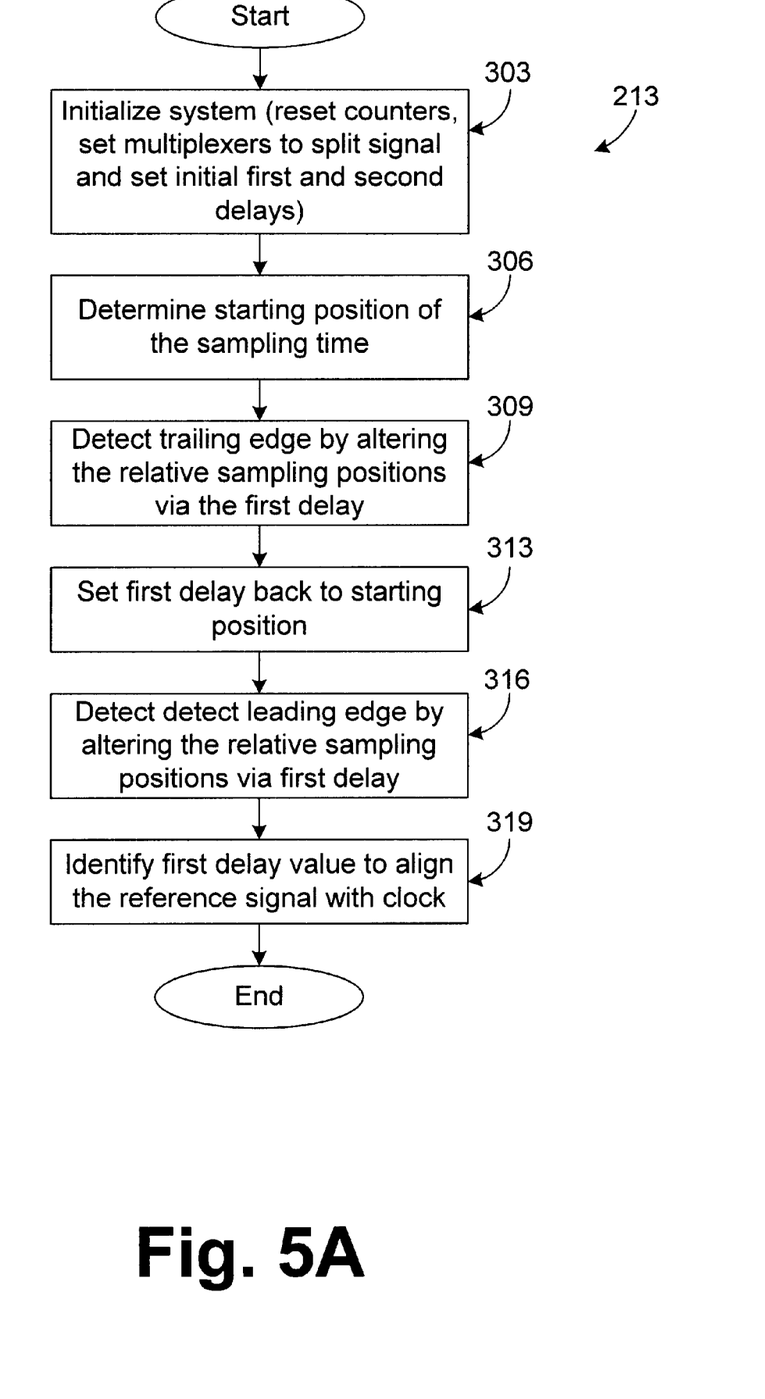
FIG. 5A is a flow chart of detection logic executed by the stable region detector of FIG. 4.

With reference then, to FIG. 5A, shown is a flow chart of the detection logic 213. Beginning with block 303, the system is initialized by resetting the counters 239 and 243 (FIG. 4), setting the input multiplexers 216 and 219 (FIG. 4) to split the signal input, and setting the initial delays via the variable delays 223 and 226 (FIG. 4), where the sampling functions of the flip-flops 229 and 233 (FIG. 4) are disabled. Then, in block 306, a starting position for the positive clock transition 155 (FIG. 3) for which both the reference and delayed reference signals 151 and 153 are stable (in the stable zone 169) is determined by manipulating the variable delays 223 and 226 and sampling the signals for the requisite number of clock periods. If the transition counter 239 remains at zero for the requisite number of clock cycles, then the particular positive clock transition 155 is within the stable region of both the signals 151 and 153 as discussed previously. Note that the starting position may be found using a sweep search pattern, binary search pattern, or a random search pattern, etc.

After a starting position for the positive clock transition 155 is established, the detection logic progresses to block 309 in which the trailing boundary 163 is detected relative to the positive clock transition 155 and, consequently, the clock period. This is done by manipulating the first variable delay and taking a number of samples via the flip flops 229 and 233 for each positive clock transition 155 established according to the search pattern employed as will be discussed. When the tap on the first variable delay 223 is discovered that is closest to the trailing boundary 163, the detection logic 309 moves to block 313 in which the first delay is set back to the starting position discovered in block 313. Note that the first delay may be set back to a point that is different than the starting position in light of the fact that the size of the stable region 156 can be estimated. Thereafter, in block 316, the leading boundary 166 is discovered by altering the first variable delay 223 according to the particular chosen search pattern employed. Thereafter, in block 319, once the taps of the first variable delay are known that are closest to the trailing and leading boundaries 163 and 166, the first variable delay 223 preferably is set at the midpoint between the boundaries in a manner so that the reference clock is properly aligned for data acquisition. Note that the actual variable delay 223 is preferably used during data acquisition as the imperfections in the delay components may vary from one variable delay to another. The variable delay 223 is then employed along with the flip-flop 229 with other components not disclosed herein to accomplish the functions of the logic analyzer 100.

Figure 5B:
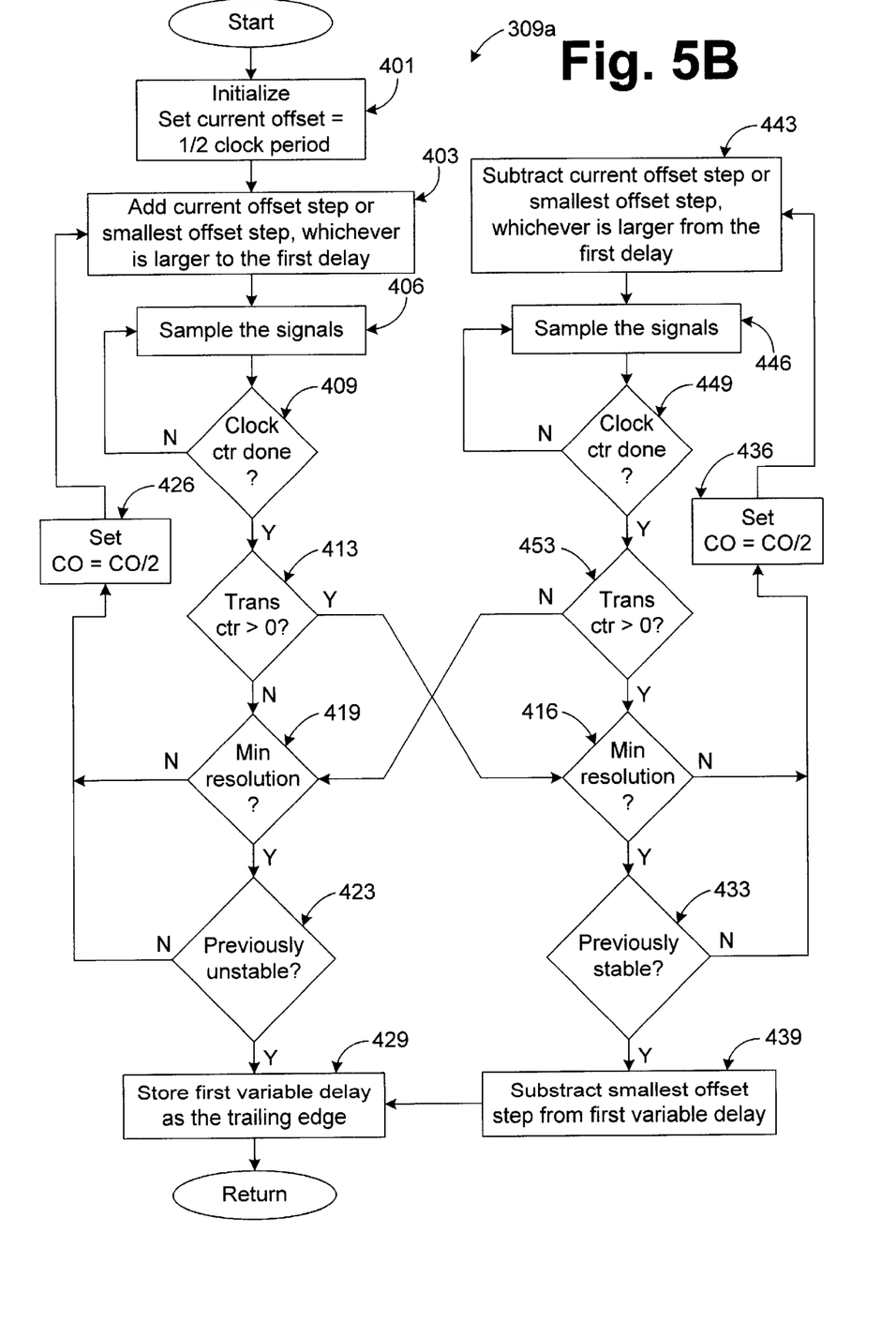
FIG. 5B is a flow chart of a subroutine of the detection logic of FIG. 5A.

Turning then, to FIG. 5B, shown is a flow chart of a binary detection subroutine 309a that is executed by the processor 203 to detect the trailing boundary 163 (FIG. 2) in block 309 (FIG. 5A). Beginning at block 401, the subroutine is initialized in which a current offset step variable is set equal to a half of the period for a single cycle of the clock signal from the target system. The current offset step represents the amount of a time shift applied to the reference signal 151 (FIG. 3) in changing the position of the reference signal 151 relative to the positive clock transition 155. Thereafter, the subroutine 309a progresses to block 403 in which the current offset step or the smallest possible offset step is added to the current setting of the first variable delay 223 (FIG. 4). Then, the subroutine 309a moves to block 406 in which the reference signal 151 and the delayed reference signal 153 are sampled simultaneously by enabling the flip-flops 229 and 233 (FIG. 4). The signals 151 and 153 are sampled a number of times depending upon the minimum threshold number of clock cycles chosen as determined by monitoring the value held by the clock counter 243.

In block 409, it is determined whether the requisite number of clock periods has occurred as measured by the clock counter 243. If so, then the subroutine continues to block 413. If not, then the subroutine 309a reverts back to block 406. Once in block 413, then the subroutine 309a examines the transition counter 239 to see if the counter is greater than zero. If so, then the positive clock transition 155 is in the transition zone 173 (FIGS. 3A–3D) and has moved beyond the stable zone 169 and into the adjacent transition zone 173 and, consequently, the subroutine 309a moves to block 416. On the other hand, if the transition counter 239 is equal to zero, then the positive clock transition 155 remains in the stable zone 169 (FIGS. 3A–3D) in the stable regions 156 of both signals 151 and 153 and the subroutine 309a progresses to block 419.

Assuming that the subroutine 309a progresses to block 419, then it is determined whether the offset step is equal to the minimum delay resolution available with the first and second variable delays 223 and 226. In other words, it is determined if the offset step is equal to or lower than the minimum delay available in the first and second variable delays 223 and 226. If the minimum delay resolution has been reached, then the subroutine 309a proceeds to block 423. If not, then the subroutine 309a moves to block 426. In block 423, it is determined whether the positive clock transition 155 has been within the transition zone 173 in the previous shift of the reference signal 151. If so, then the subroutine moves to block 429. If not, then the subroutine 309a moves to block 426. In block 426, the current offset step is reduced by half and, thereafter, the subroutine 309a reverts back to block 403.

Referring back to block 413, if the transition counter 239 holds a value greater than zero, then the subroutine 309 progresses to block 416. In block 416, it is determined whether the current offset step is equal to the minimum delay resolution in a similar manner to block 419. If so, then the subroutine 309a moves to block 433. If not, then the subroutine 309a moves to block 436. In block 433, it is determined whether the previous position of the positive clock transition 155 was within the stable zone 169. If so, then the subroutine 309a progresses to block 439. If not, then the subroutine 309a reverts to block 436.

In block 436, the current offset step is reduced by half and thereafter, the subroutine 309a progresses to block 443. In block 443, the first variable delay 223 is reduced by either the current offset step or the smallest delay increment of the first variable delay 223, whichever is larger. Thereafter, the subroutine 309a progresses to blocks 446, 449, and 453 that perform function identical to blocks 406,409 and 413. Finally, in block 439 the smallest delay increment of the first variable delay 223 is subtracted from the current setting of the first variable delay 223, thereby identifying the precise delay in the first variable delay 223 that indicates the trailing boundary 163 of the reference signal 151. Thereafter, in block 429, the setting of the first variable delay 223 is stored for future reference.

Thus, the flow chart of FIG. 5B shows how the detection logic 213 determines where the trailing boundary 163 is in the reference signal 151 by moving back and forth across the trailing boundary 163 itself, converging upon the delay increment next to the trailing boundary 163. With respect to determining the leading boundary 166 in block 316 (FIG. 5A), the same subroutine 309a can be employed to determine the leading boundary 166 as well by generally changing all subtractions into additions and vice versa.

Figure 5C:
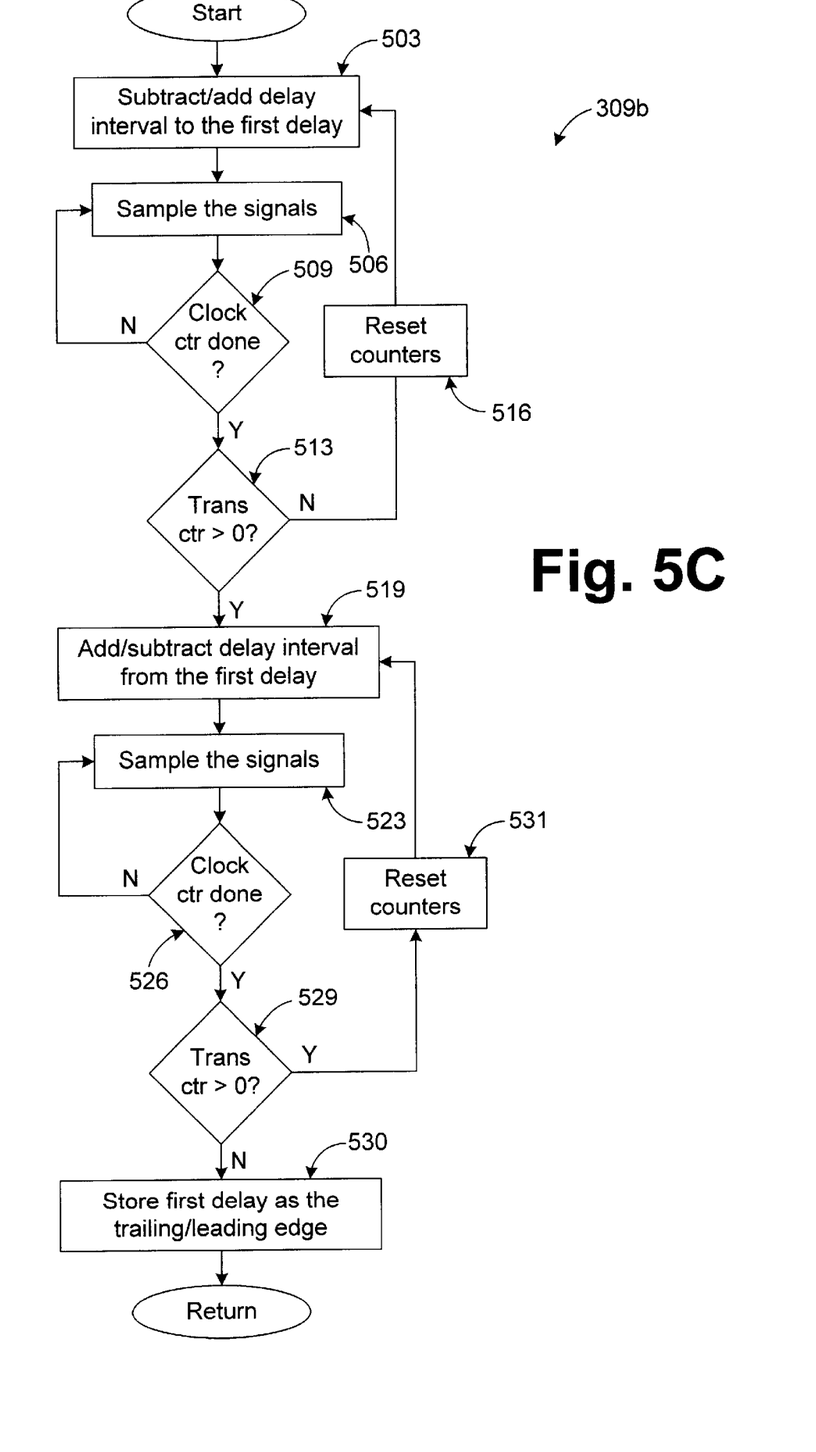
FIG. 5C is a flow chart of a subroutine of the detection logic of FIG. 5A.

With reference to FIG. 5C, shown is a flow chart of a sweep sampling subroutine 309b that is executed by the processor 203 to detect the trailing and leading boundaries 163 and 166 (FIG. 2) in block 309 (FIG. 5A) using a sweep search pattern. Beginning with block 503, a delay interval is subtracted or added to the first variable delay 223 to advance the positive clock transition 155 (FIG. 2) toward the trailing or leading boundary 163 or 166. Thereafter, in block 506 the reference signal 151 and the delayed reference signal 153 are sampled by enabling the flip-flops 229 and 223 (FIG. 4). In block 509, it is determined whether the clock counter 243 (FIG. 4) has reached the predetermined number of clock cycles that, for example, may be approximately 100,000. If in block 509, the clock counter 243 has not reached the predetermined number of clock cycles, then the subroutine 309b reverts back to block 506. If the clock counter 243 has reached the predetermined number of clock cycles, then the subroutine 309b progresses to block 513.

In block 513, the subroutine 309b determines whether the transition counter 239 is greater than zero. If the transition counter 239 is equal to zero, then the subroutine 309b moves to block 516 in which the clock and transition counters 239 and 243 are reset. On the other hand, if the transition counter 239 is greater than zero, then the subroutine 309b continues to block 519. Whether or not the transition counter 239 is equal to or greater than zero depends upon whether the positive clock transition 155 has been placed from the stable zone 169 into the transition zone 173 by the incremental change in block 503. According to the sweep search pattern, the first variable delay 223 is changed incrementally until the positive clock transition 155 leaves the stable zone 169 to discover the trailing or leading boundary 163 or 166.

In block 516, after the counters are reset, the subroutine 309b reverts back to block 503 to advance the positive clock transition 155 by one more delay interval. If, however, the subroutine 309b continues to block 519, then the subroutine 309b either adds or subtracts the delay interval from the first variable delay 223. In this manner, the positive clock transition 155 is backed-off away from regions of instability to a point in the stable region 156 of the reference signal 151 just inside the trailing or leading boundary 163 or 166. Thereafter, in block 523, the flip-flops 229 and 223 are enabled and the signals 151 and 153 are again sampled until the clock counter 243 reaches the aforementioned limit. In block 526, if the clock counter 243 has not reached its limit, then the subroutine 309b reverts back to block 523. On the other hand, if the limit is reached, then the subroutine 309b moves on to block 529.

In block 529, it is determined whether the transition counter 239 is greater than zero. If so, then the subroutine 309b moves to block 531 in which the counters 239 and 243 are reset. This is because the positive clock transition 155 still remains in a position of instability and the stable region 156 has not been reached. Thereafter the subroutine 309b reverts back to block 519. On the other hand, if in block 529 the transition counter 239 is equal to zero, then the subroutine 309b progresses to block 530 in which the particular delay of the first variable delay 223 is stored as the trailing or leading boundary 163 or 166. Thereafter, the subroutine 309b returns to block 309 of FIG. 5A.

Figure 6:
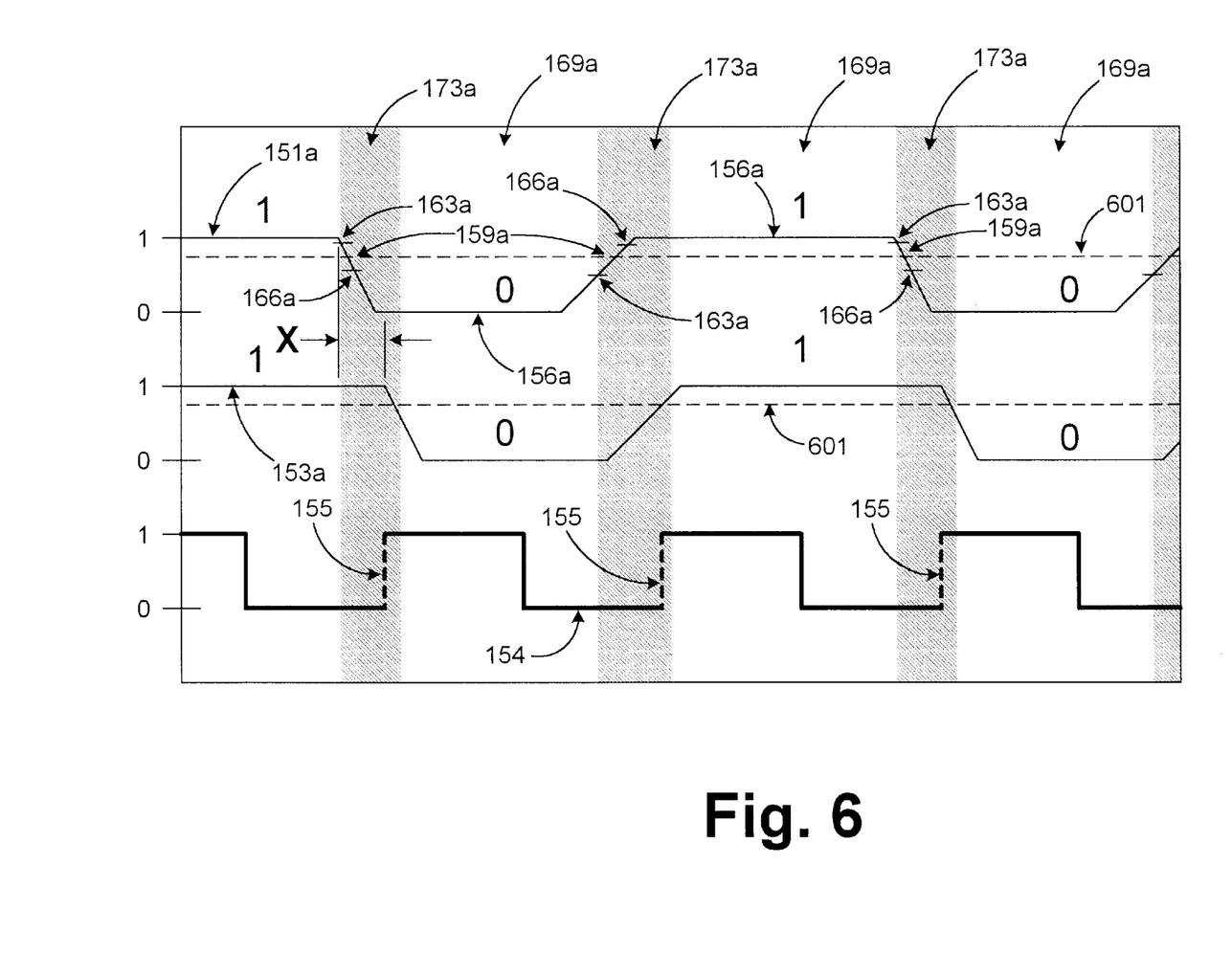
FIG. 6 is a graph of another reference signal, a delayed reference signal, and a clock signal.

Turning then, to FIG. 6, shown is a graph of a reference signal 151a and a delayed version of the reference signal 153a with respect to the clock signal 154. The graph depicts the signals as would be seen on an oscilloscope. Like the graph of FIG. 2, the graph of FIG. 6 has stable regions 156a that extend between respective pairs of adjacent leading boundaries 163a and trailing boundaries 166a. The graph also shows stable zones 169a in which the data value for both the reference signal 151a and the delayed reference signal 153a are equal, as well as transition zones 173a in which the same data values are subject to inequality.

Note that the reference signal 151a is not very symmetrical where the transitions between data values have differing slew rates as shown. This results in variation in stable regions 156a, stable zones 169a, transition regions 159a, and transition zones 173a as shown. These variations are created due to variation in the drivers in the target system that result in different slew rates as well as the fact that different drivers may not react consistently to the clock transition 155.

The graph of FIG. 6 also shows an input threshold 601 at which a transition between a logical "1" and a logical "0" is determined in the logic analyzer 100 using comparators and other circuitry that processes the signals before the stable region detector 120 (FIG. 1). Thus, according to the present invention, a variation in the input threshold 601 results in corresponding variation in the size of the stable zones 169a, transition zones 173a, stable regions 156a, and the transition regions 159a. Thus, a particular input threshold 601 may be more desirable as it results in larger stable regions 156a and stable zones 169a. Consequently, it may be desirable to perform the detection logic 213 (FIG. 5A) multiple times, each time with a different input threshold 601 and corresponding upper and lower transition thresholds 603 and 606. In particular, the detection logic 213 is performed with different input thresholds 601 and the corresponding stable regions 156a discovered are compared to each other to find the largest to use to perform the subsequent logical analysis.

In addition, some target systems employ busses with a number of tri-state drivers to allow multiple drivers to share the same conductors at different times as is known in the art. The use of tri-state drivers as such may complicate the detection of the stable regions 156a. In particular, the time of the electrical transitions from a logical "1" to a logical "0" or vice versa in such devices may vary greatly. Also, a time lag may occur when switching from one tri-state device to another where the data bus is not driven and "drifts". In some cases, the drifting may actually cause a transition that is counted by the transition counter 239 (FIG. 4) within what normally may be a stable region 156a. In these situations, the value of the transition counter 239 when sampling a position in the stable region 156a may be greater than zero, even though the sampling position is located in a stable zone 169a.

This contingency may be resolved, however, by examining the values obtained from the transition counter 239 for the various sampling positions. If the number is nominal in size in comparison to numbers from sampling position in transition zones, then it indicates transitions due to the drifting of the value on the bus. Any nominal value may be ignored or assumed to be zero for purposes of sampling the signal on the conductor in question. Thus, the detection logic 213 (FIG. 4) may include logic to compare the values obtained to a nominal threshold and logic to ignore or eliminate the nominal values detected. As an alternative, the detection logic 213 may include logic to generate a display of the values for the transition counter 239 for the various sampling positions to the user on a display device. The user may then manually set the first variable delay 223 (FIG. 4) based upon the displayed information. In such a case, a sweep search pattern may be preferred to provide a display of sampling positions across the stable region 156a in question.

With reference to FIGS. 4–5C, the detection logic of the present invention can be implemented in hardware, software, firmware, or a combination thereof In the preferred embodiment(s), the detection logic is implemented in software or firmware that is stored in a memory and that is executed by a suitable instruction execution system. If implemented in hardware, as in an alternative embodiment, the detection logic can implemented with any or a combination of the following technologies, which are all well known in the art: a discrete logic circuit(s) having logic gates for implementing logic functions upon data signals, an application specific integrated circuit having appropriate logic gates, a programmable gate array(s) (PGA), a fully programmable gate array (FPGA), etc.

Also, the flow charts of FIGS. 5A–C show the architecture, functionality, and operation of a possible implementation of the detection logic of FIGS. 5A–C. In this regard, each block represents a module, segment, or portion of code, which comprises one or more executable instructions for implementing the specified logical function(s). It should also be noted that in some alternative implementations, the functions noted in the blocks may occur out of the order noted in FIGS. 5A–C. For example, two blocks shown in succession in FIGS. 5A–C may in fact be executed substantially concurrently or the blocks may sometimes be executed in the reverse order, depending upon the functionality involved.

Finally, the detection logic 213, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Many variations and modifications may be made to the above-described embodiment(s) of the invention without departing substantially from the spirit and principles of the invention. All such modifications and variations are intended to be included herein within the scope of the present invention.

What is claimed is:

1. A system for detecting a stable region in a data signal, comprising:
   a processor coupled to a local interface;
   a memory coupled to the local interface;
   a boundary detection circuit configured to perform a simultaneous sampling of a reference signal and a delayed version of the reference signal to ascertain a number of transitions at a selectable position of the reference signal with respect to an associated clock input; and
   boundary detection logic stored on the memory and executed by the processor to control the operation of the boundary detection circuit, the boundary detection logic including logic to detect a boundary of the stable region of the reference signal by sampling a number of the selectable positions of the reference signal according to a search pattern.

2. The system of claim 1, wherein the boundary detection logic further comprises logic to sample the selectable positions of the reference signal according to a binary search pattern.

3. The system of claim 1, wherein the boundary detection logic further comprises logic to sample the selectable positions of the reference signal according to a sweep search pattern.

4. The system of claim 1, wherein the boundary detection logic further comprises logic to determine a clock position between a leading boundary and a trailing boundary of the stable region, thereby facilitating data acquisition.

5. The system of claim 1, wherein the boundary detection logic further comprises logic to vary an input threshold.

6. The system of claim 1, wherein the boundary detection logic further comprises logic to ignore the transitions associated with at least one of the selectable positions of the reference signal, wherein the reference signal is a drifting tri-stated signal.

7. The system of claim 2, wherein the boundary detection logic further comprises:
   logic to sample the selectable positions of the reference signal according to a positive binary search pattern to detect a trailing boundary of the stable region; and
   logic to sample the selectable positions of the reference signal according to a negative binary search pattern to detect a leading boundary of the stable region.

8. The system of claim 3, wherein the boundary detection logic further comprises:
   logic to sample the selectable positions of the reference signal according to a positive sweep search pattern to detect a trailing boundary of the stable region; and
   logic to sample the selectable positions of the reference signal according to a negative sweep search pattern to detect a leading boundary of the stable region.

9. A system for detecting a stable region in a data signal, comprising:
   sampling means for performing a simultaneous sampling of a reference signal and a delayed version of the reference signal to ascertain a number of transitions at a selectable position of the reference signal with respect to an associated clock input; and
   detection means for detecting a boundary of the stable region of the reference signal by sampling a number of the selectable positions of the reference signal according to a search pattern.

10. A The system of claim 9, wherein the detection means further comprises means for sampling the selectable positions of the reference signal according to a binary search pattern.

11. The system of claim 9, wherein the detection means further comprises means for sampling the selectable positions of the reference signal according to a sweep search pattern.

12. The system of claim 9, wherein the detection means further comprises means for determining a clock position between a leading boundary and a trailing boundary of the stable region, thereby facilitating data acquisition.

13. The system of claim 10, wherein the detection means further comprises:
   means for sampling the selectable positions of the reference signal according to a positive binary search pattern to detect a trailing boundary of the stable region; and
   means for sampling the selectable positions of the reference signal according to a negative binary search pattern to detect a leading boundary of the stable region.

14. A method for detecting a stable region in a data signal, comprising the steps of:
   performing a simultaneous sampling of a reference signal and a delayed version of the reference signal to ascertain a number of transitions at a selectable position of the reference signal with respect to an associated clock input; and
   detecting a boundary of the stable region of the reference signal by sampling a number of the selectable positions of the reference signal according to a search pattern.

15. The method of claim 14, wherein the step of detecting a boundary of the stable region further comprises the step of sampling the selectable positions of the reference signal according to a binary search pattern.

16. The method of claim 14, wherein the step of detecting a boundary of the stable region further comprises the step of sampling the selectable positions of the reference signal according to a sweep search pattern.

17. The method of claim 14, wherein the step of detecting a boundary of the stable region further comprises the step of determining a clock position between a leading boundary and a trailing boundary of the stable region, thereby facilitating data acquisition.

18. A system for detecting a stable region in a data signal, comprising:
   a processor coupled to a local interface;
   a memory coupled to the local interface;
   a boundary detection circuit configured to perform a simultaneous sampling of a reference signal and a delayed version of the reference signal to ascertain a number of transitions at a selectable position of the reference signal with respect to an associated clock input; and
   boundary detection logic stored on the memory and executed by the processor to control the operation of the boundary detection circuit, the boundary detection logic including logic to detect a boundary of the stable region of the reference signal by sampling a plurality of selectable positions of the reference signal according to a search pattern, and logic to determine a stable starting position in the reference signal and the delayed version of the reference signal.

19. The system of claim 18, wherein the boundary detection logic further comprises logic to sample the plurality of selectable positions of the reference signal according to a binary search pattern.

20. The system of claim 19, wherein the boundary detection logic further comprises:
   logic to sample the plurality of selectable positions of the reference signal according to a positive binary search pattern to detect a trailing boundary of the stable region; and
   logic to sample the plurality of selectable positions of the reference signal according to a negative binary search pattern to detect a leading boundary of the stable region.

21. The system of claim 18, wherein the boundary detection logic further comprises logic to sample the plurality of selectable positions of the reference signal according to a binary search pattern.

22. The system of claim 21, wherein the boundary detection logic further comprises:
   logic to sample the plurality of selectable positions of the reference signal according to a positive sweep search pattern to detect a trailing in boundary of the stable region; and
   logic to sample the plurality of selectable positions of the reference signal according to a negative sweep search pattern to detect a leading boundary of the stable region.

23. The system of claim 18, wherein the boundary detection logic further comprises logic to sample the plurality of selectable positions of the reference signal according to a sweep search pattern.

24. The system of claim 18, wherein the boundary detection logic further comprises logic to determine a clock position between a leading boundary and a trailing boundary of the stable region, thereby facilitating data acquisition.

25. The system of claim 18, wherein the boundary detection logic further comprises logic to vary an input threshold.

26. The system of claim 18, wherein the boundary detection logic further comprises logic to ignore the transitions associated with at least one of the plurality of selectable positions of the reference signal, wherein the reference signal is a drifting tri-stated signal.

27. A system for detecting a stable region in a data signal, comprising:

sampling means for performing a simultaneous sampling of a reference signal and a delayed version of the reference signal to ascertain a plurality of transitions at a selectable position of the reference signal with respect to an associated clock input; and detection means for detecting a boundary of the stable region of the reference signal by sampling a plurality of selectable positions of the reference signal according to a search pattern, and for determining a stable starting position in the data signal.

28. The system of claim 27, wherein the detection means further comprises means for sampling the plurality of selectable positions of the reference signal according to a binary search pattern.

29. The system of claim 28, wherein the detection means further comprises:

means for sampling the plurality of selectable positions of the reference signal according to a positive binary search pattern to detect a trailing boundary of the stable region, and means for sampling the plurality of selectable positions of the reference signal according to a negative binary search pattern to detect a leading boundary of the stable region.

30. The system of claim 27, wherein the detection means further comprises means for sampling the plurality of selectable positions of the reference signal according to a sweep search pattern.

31. The system of claim 27, wherein the detection means further comprises means for determining a clock position between a leading boundary and a trailing boundary of the stable region, thereby facilitating data acquisition.

32. A method for detecting a stable region in a data signal, comprising the steps of:

performing a simultaneous sampling of a reference signal and a delayed version of the reference signal to ascertain a number of transitions at a selectable position of the reference signal with respect to an associated clock input; and detecting a boundary of the stable region of the reference signal by sampling a plurality of selectable positions of the reference signal according to a search pattern, and determining a stable starting position in the data signal.

33. The system of claim 32, wherein the step of detecting a boundary of the stable region further comprises the step of sampling the plurality of selectable positions of the reference signal according to a binary search pattern.

34. The system of claim 32, wherein the step of detecting a boundary of the stable region further comprises the step of sampling the plurality of selectable positions of the reference signal according to a sweep search pattern.

35. The system of claim 32, wherein the step of detecting a boundary of the stable region further comprises the step of determining a clock position between a leading boundary and a trailing boundary of the stable region, thereby facilitating data acquisition.

* * * * *